(12) United States Patent
Busletta et al.

(10) Patent No.: US 7,180,397 B1
(45) Date of Patent: Feb. 20, 2007

(54) PRINTED WIRING BOARD HAVING EDGE PLATING INTERCONNECTS

(75) Inventors: Galliano R. Busletta, Mesquite, TX (US); Robert J. Roessler, Rockwall, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 241 days.

(21) Appl. No.: 10/783,073

(22) Filed: Feb. 20, 2004

(51) Int. Cl.
*H01F 5/00* (2006.01)

(52) U.S. Cl. ...................................... 336/200

(58) Field of Classification Search .................. 336/65, 336/83, 200–208, 232; 361/760–766
See application file for complete search history.

(56) References Cited

U.S. PATENT DOCUMENTS

| 3,349,480 | A | * | 10/1967 | Rashleigh | 29/852 |
| 6,073,339 | A | * | 6/2000 | Levin | 29/606 |
| 6,128,817 | A | | 10/2000 | Roessler et al. | |
| 6,262,649 | B1 | | 7/2001 | Roessler et al. | |
| 6,353,379 | B1 | | 3/2002 | Busletta et al. | |

* cited by examiner

*Primary Examiner*—Tuyen T Nguyen

(57) ABSTRACT

The present invention provides a PWB for attaching electrical components thereto. The PWB includes a stack of insulating layers, conductive layers located between the insulating layers, wherein the conductive layers terminate at an edge of the PWB, and an edge plate interconnect located on the edge. The edge plate interconnect is free of a complementary via and contacts and electrically interconnects the conductive layers. The present invention also provides a method of making the PWB and also provides a power converter implementing the edge plate interconnects.

3 Claims, 8 Drawing Sheets

PRINTED WIRING BOARD HAVING EDGE PLATING INTERCONNECTS

TECHNICAL FIELD OF THE INVENTION

The present invention is directed, in general, to printed wiring boards (PWB) and, more specifically, to a power converter board having edge plating interconnects that interconnect various layers within a PWB, to thereby reduce via requirements and increase usable space on the PWB for other components.

BACKGROUND OF THE INVENTION

In general, the demand for smaller, yet more powerful, electronic circuit modules, which have more features or capabilities and greater component density than their predecessors, has been increasing. This is especially true in the case of power converters that are often employed in power supplies. A power converter is a power processing circuit that converts an input voltage waveform into a specified output voltage waveform. In many applications requiring a DC output, switched-mode DC/DC power converters are frequently employed to advantage wherein both high conversion density and converter efficiency are key design requirements.

These switched-mode DC/DC power converters generally include, among other components, an inverter, an isolation transformer, and a rectifier on a secondary side of the isolation transformer. The inverter typically includes a main power switch that employs metal oxide semiconductor field effect transistors (MOSFETs) to convert a DC input voltage to an AC voltage. Then, the isolation transformer transforms the input AC voltage to an output AC voltage and the rectifier generates the desired DC voltage at the output of the power converter. The main power switch and rectifier switches are usually operated at relatively high switching frequencies. This allows the use of smaller components, such as inductors and capacitors, within the power converter.

In these devices, electrical connections between the various layers and components are typically accomplished with the use of vias, which, as well known, are openings or holes that extend through the board and that are typically have a conductive material, such as solder, therein. In some cases, they are also used to mechanically attach an electrical component, such as a transformer, to a PWB. Presently in technologies that implement core-on-board transformer technologies, vias are used to make connections to field effect transistors (FETs) and other components and drop into the board and then to the windings of the transformer and then back out.

Unfortunately, however, these vias consume valuable board space. When the board layout is complex and includes many electrical components, the number o vias (and the concomitant amount of board space consumed by them) increase dramatically. Such space requirements are necessary because no other components should overlay the via, and preferably, they should not be too close to the via. When a larger number of vias are required for the board layout, it becomes very difficult for manufacturers to keep the board dimensions and layout within specified design requirements and yet still make the number of electrical connections that are required for the desired operation of the device. In addition, the typical via is a through-hole via, and since it goes through all layers, routing of conductive traces on internal layers becomes an issue. Moreover, the electronics industry is quickly moving to on-board technology where more, if not all, of the components are formed directly on or within the board itself. This advancement in technology reduces the number of separate components that are soldered directly to the board. Thus, it is becoming ever more imperative that all space of the board is efficiently utilized.

Accordingly, what is needed is an electronic board with an interconnect system that over comes the disadvantages associated with via interconnects of the prior art PWBs.

SUMMARY OF THE INVENTION

To address the above-discussed deficiencies of the prior art, the present invention provides a PWB for attaching electrical components thereto. In one embodiment, the PWB includes a stack of insulating layers, conductive layers located between the insulating layers, wherein at least a portion of the conductive layers terminates at a continuous edge of a PWB, and an edge plate interconnect located on the continuous edge of the PWB that contacts at least a portion of said conductive layers at said continuous edge.

In another aspect, the present invention provides a method of manufacturing electrical interconnects for a PWB. In one exemplary embodiment, the method includes providing a stack of insulating layers, placing conductive layers between the insulating layers, wherein the conductive layers terminate at a continuous edge of the PWB, and forming an edge plate interconnect on the continuous edge of the PWB that contacts said conductive layers at said continuous edge.

In yet another aspect of the present invention, there is provided a power converter. In one particular embodiment, the power converter includes a PWB having conductive layers terminating at a continuous edge of the PWB, edge plate interconnects located on the continuous edge of the PWB, wherein the edge plate interconnect contacts and electrically connects at least a portion of the conductive layers. The power converter further includes a transformer including primary and second windings. The primary winding is coupled to a primary circuit by at least one via, and the secondary winding is coupled to a secondary circuit by at least one of the edge plate interconnects.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

The present invention uniquely provides an edge plate interconnect that can be used to replace conventional vias for making interconnections through a PWB. This edge plate interconnect technology provides several advantages over the prior art, because it allows for more diverse electrical interconnections throughout the board, while providing additional space on the board. This additional space allows the manufacturer to achieve the appropriate design size and component densification that are both presently required by the electrical component industry in its implementation of present day on-board technology. As discussed in more detail below, the edge plating interconnect may be used to make interconnections between conductive layers, such as windings of a transformer and its associated components by uniquely placing the connection within a core-on-board opening that is already required by the design or another cut-out that might exist or be purposefully made in the PWB for such an application. Additionally, the edge plating interconnect may be placed at a continuous outer perimeter edge of the PWB to interconnect layers that sufficiently extend to the continuous edge. All of these alternative locations afford a significant increase in the number of connections to various components that can be made without sacrificing space within interior portions of the PWB, thus meeting industry's strict size and component density requirements for on-board technologies.

Figure 1:
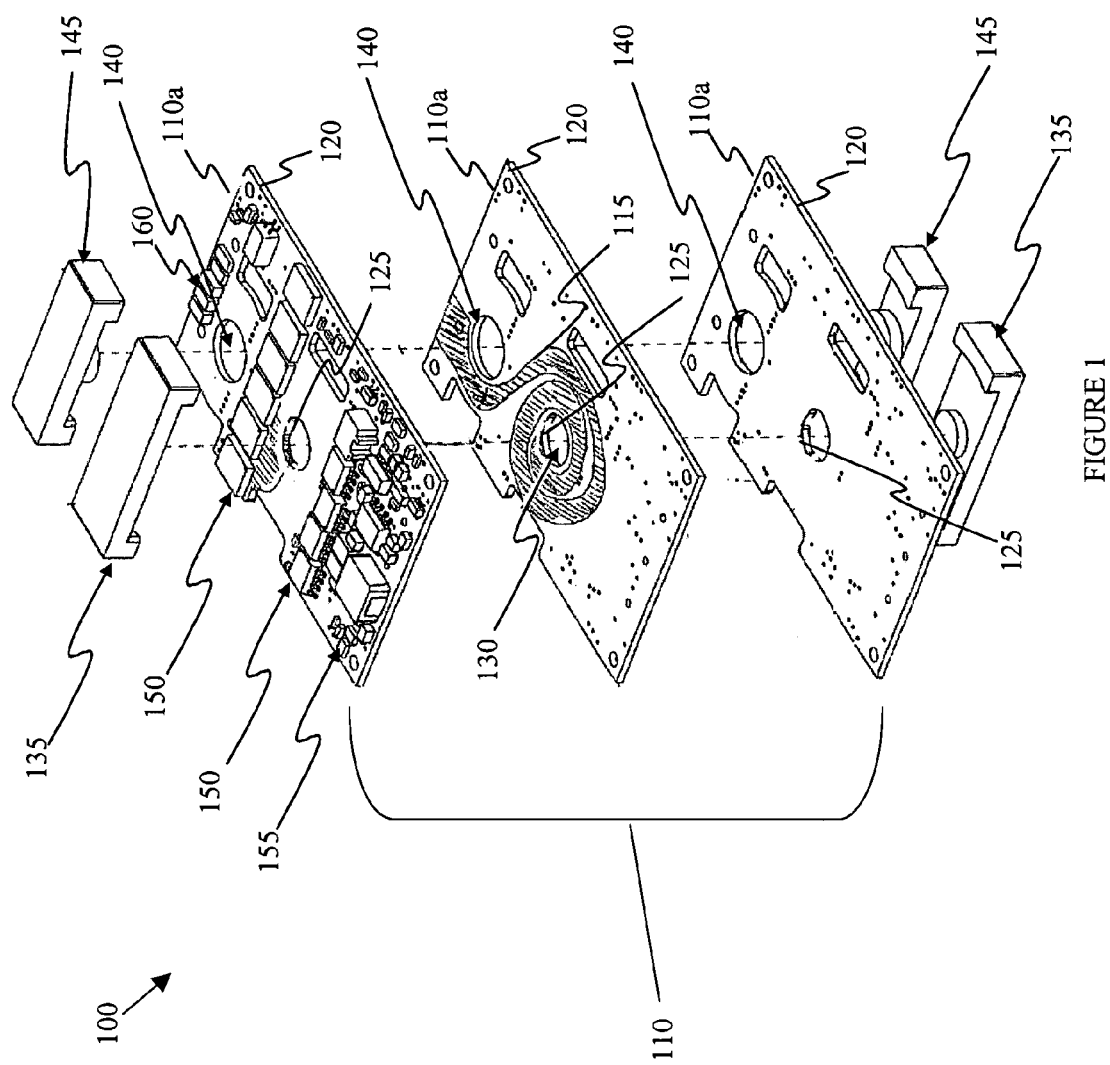
FIG. 1 illustrates a simplified, exploded view of an embodiment of a power converter formed on a PWB constructed according to the principles of the present invention.

Referring initially to FIG. 1, illustrated is a simplified, exploded view of an embodiment of a power converter 100 formed on a PWB 110, constructed according to the principles of the present invention. It should be noted at the outset that while detailed discussion is primarily directed to a power converter device, this is exemplary in nature only. Moreover, even though detailed discussion is directed to a power converter device, the present invention is applicable in any PWB board that can be used for any type of electrical application. In the exemplary embodiment shown in FIG. 1, the PWB 110 includes a stack of insulating layers 110a and conductive layers, as individually described below. In an advantageous embodiment, these insulating layers are constructed with conventional materials. The number and configuration of these layers in the PWB 110 will depend on the design and overall power requirements of the device in which it is to be used. The PWB 110 also includes a conductive layer 115, such as a conventionally patterned copper layer, formed on one of the insulating layers 110a. Even though the present figure illustrates just one conductive layer 115, it should be understood that, typically, a conductive layer 115 will be located between each pair of insulating layers 110a, and each conductive layer 115 will be patterned to design specifications, and in some instances, will have different pathway and interconnect configurations. However, designs may vary, and a conductive layer may not necessarily be between every pair of insulating layers 110a or may even be a trace on top of the PWB itself.

The insulating layers 110a have continuous edges 120, 125. Edge 120 is located at the exterior perimeter of the PWB 110, while edge 125 is located within an interior of the PWB 110 and within an opening 130 that is formed through the PWB 110. In one embodiment, the opening 130 may serve as a pass through opening for a magnetic core element 135, such as the illustrated e-type magnetic core, that can form a transformer for the power converter 100. However, in other embodiments, the opening may simply be an intentional cut-off for providing an edge plating surface, or it may be an opening formed for some other component that is intended to be attached to the PWB 110.

The PWB 110 may also include another opening 140 that can serve as a pass through opening for a magnetic core element 145, which may also be an e-type magnetic core. This particular magnetic core element 145 may form an inductor for the power converter 100. Further illustrated in this exploded view are other conventional electrical components, such as FETs 150, resistors 155, and capacitors 160, all of which may be employed in the power converter 100. With a general overview of the PWB 110 having been described, a more detailed discussion will now be focused on selective layers within one advantageous embodiment of the PWB 110.

It should be understood that the fabrication processes and materials used to make the PWB 110, as described herein, may be conventional, and the processes and materials used to plate conductive metal onto the continuous edge of the PWB 110 may also be conventional. Those skilled in the art, when made aware of the present invention, will be able to construct the PWB 110 and power converter 100 using conventional fabrication and plating techniques.

Figure 2:
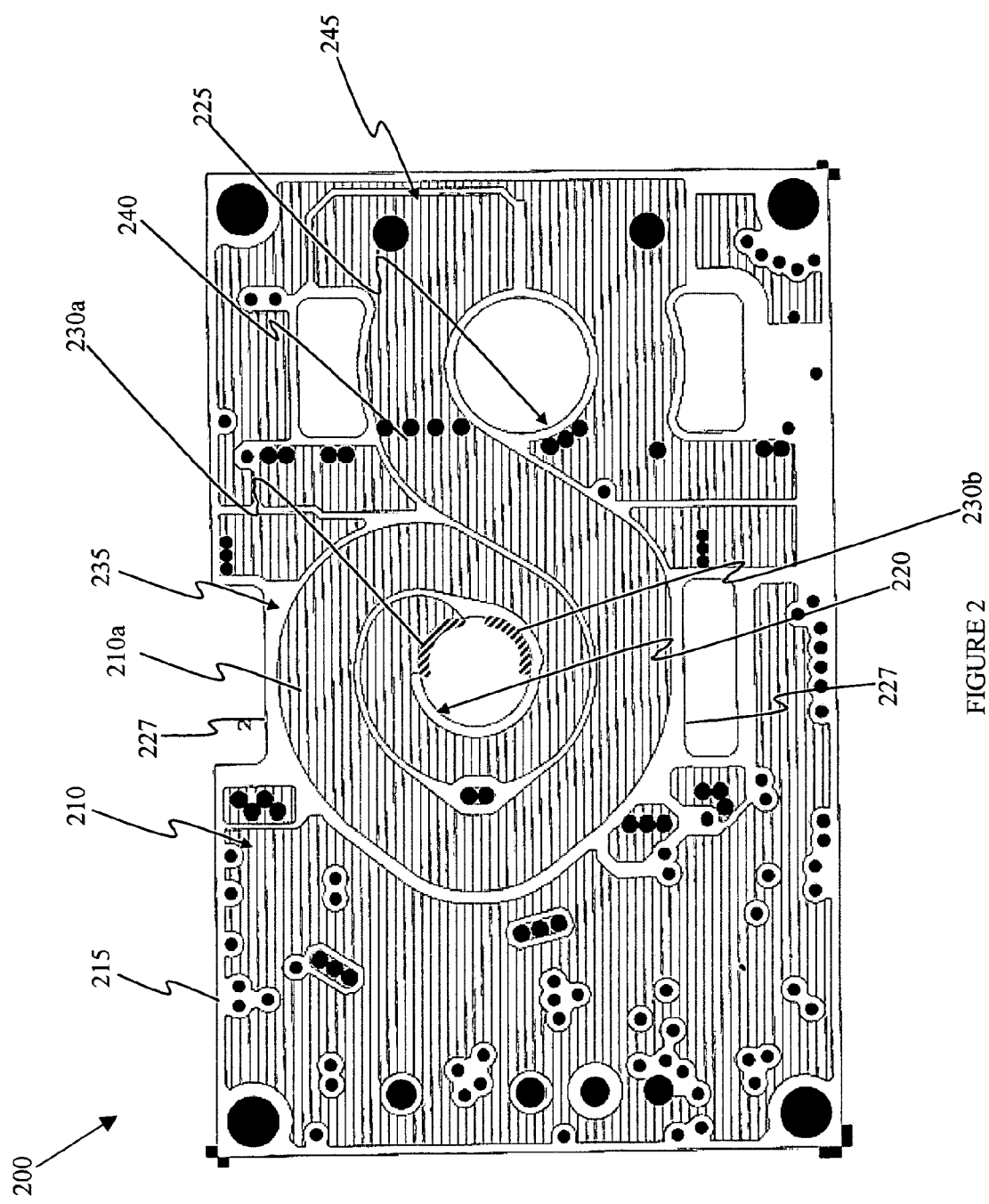
FIG. 2 illustrates an overhead view of one layer within the PWB, as provided by one embodiment of the present invention.

Turning now to FIG. 2, there is illustrated an overhead view of one insulating layer 200 of a stack of such insulating layers, as previously discussed above. In this particular view, the insulating layer 200 has a conductive layer 210, such as a copper layer, conventionally patterned thereon. The pattern of the conductive layer 210 will vary depending on design requirements. However, in this view the conductive layer 210 is patterned to form a coil trace. The insulating layer 200 has a continuous edge 215 at an outer perimeter of the insulating layer 200, which is not fully shown in this view. The insulating layer 200 further includes a continuous edge 220 and a continuous edge 225, which are cut-out edges, located within an interior portion of the insulating layer 200. It should be noted that at least some of the conductive layer 210 is co-terminus with the edge 220 in this embodiment, or at least comes close enough to the continuous edge for the plate material to plate onto the surface of the edge and make electrical contact with the conductive layer 210. In this view, the continous edge 220 is an edge of an opening formed through the insulating layer 200 that is configured to receive a magnetic core therethrough, to form a transformer, as discussed regarding FIG. 1, and continuous edge 225 is an edge of an opening formed through the insulating layer 200 that is configured to receive a magnetic core therethrough to form an inductor, as also discussed regarding FIG. 1. However, as previously mentioned, other continuous edges, such as cut-out edges 227, may also be present in the board's design and be used as an edge surface on which to plate a conductive layer to form an interconnect.

Located on edge 220 are a pair of electrically separate edge plate interconnects 230a and 230b, which appear as hatched areas, in the circular opening. As mentioned above, these edge plate interconnects 230a and 230b may be plated using conventional processes and materials. For example, the plate material may be any conventional material used to form a solder connection, such as tin/lead, gold, silver and alloys thereof. While two edge plate interconnects 230a, 230b are shown, it should be understood that, in some embodiments, only one might be present or additional edge plate interconnects might also be present. A portion of the conductive layer 210 contacts edge plate interconnect 230a and wraps around the opening in a counter clockwise direction to form a winding 210a about a transformer region 235 and extends to vias 240 that will interconnect the winding 210a to other layers. However, it should be noted that the winding 210a is also connected to other layers by the edge plate interconnect 230a. The overall configuration, width, direction, or number of turns of the winding 210a may vary depending on design requirements. In one particular embodiment, the winding 210a may form a secondary winding about the transformer region 235 that is electrically connected to a secondary circuit, not shown, by way of edge plate interconnect 230a and vias 240. As also shown, the winding 210a forms a portion of the winding around an inductor region 245. In an alternative embodiment, the cut-out, continuous edges 227 might also be plated and serve as interconnects in a manner similar to the continuous edge 220.

It should also be noted that these edge plate interconnects, as provided by the present invention, are located on a continuous edge of the PWB. As used herein, a continuous edge is an edge that is free of a recessed via located at the edge of the PWB. Recessed vias are known and are disclosed in U.S. Pat. No. 6,128,817, which is incorporated herein by reference in its entirety. In many applications, the recessed vias are also used to make mechanical connection to the PWB.

For example, in a prior art device, when a recessed via is present, it acts as a single interconnect and connects all of the conductive layers that contact it. Thus, there is no electrical separation between the groups of conductive layers contacting the recessed via, as can be provided by the present invention.

Figure 3A:
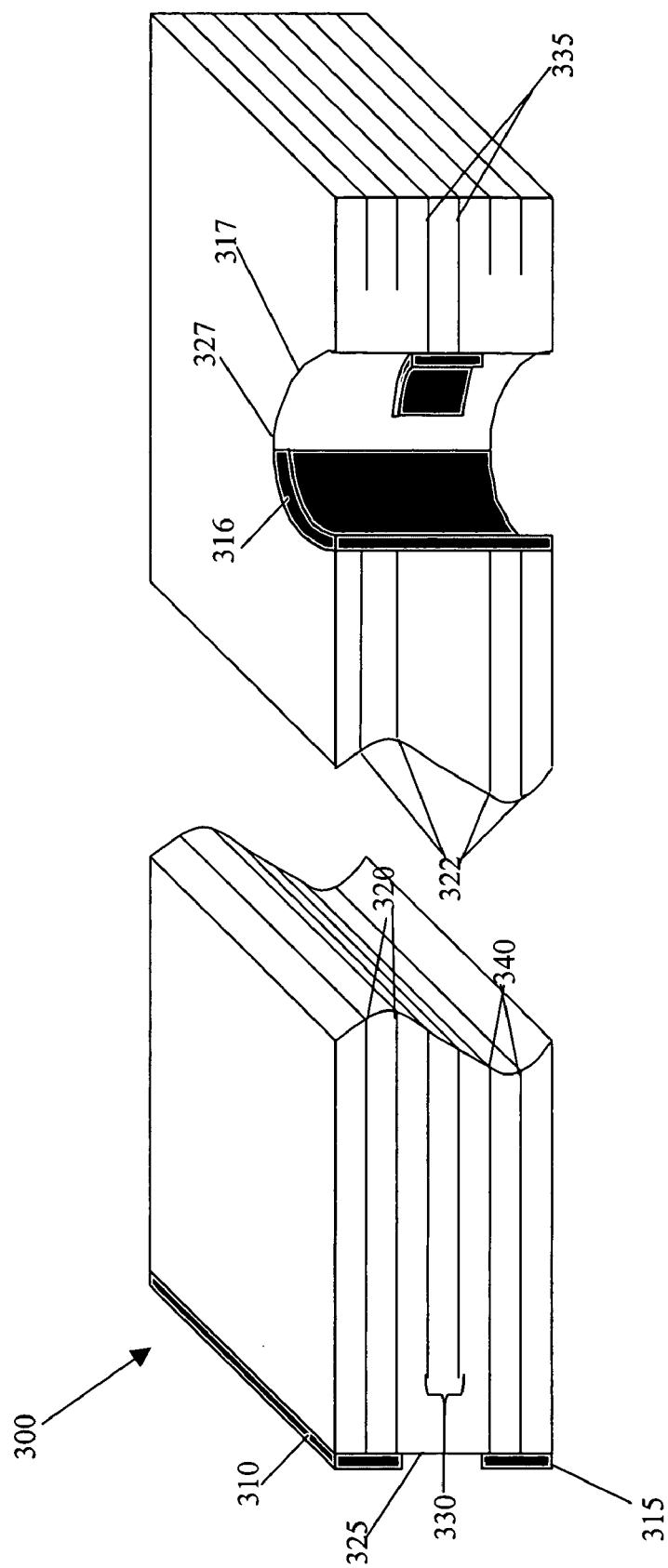
FIG. 3A illustrates an enlarged sectional view of an outer perimeter edge of a PWB and an edge within an opening formed through the PWB showing how edge plate interconnects can separately interconnect groups of conductive layers.

FIG. 3A, which is an enlarged sectional view of a continuous edge of a PWB 300, illustrates how edge plate interconnects 310, 315 and opening interconnects 316, 317 of the present invention can separately interconnect groups of conductive layers. In the illustrated embodiment, a first group 320 of conductive layers, shown as individual lines, terminate at an external, continuous edge 325 of the PWB 300 and a second group 322 of conductive layers terminate at a continuous edge of an opening 327 formed in the PWB board 300. As mentioned above, the opening 327 may be a component opening, such as a core-on-board magnet opening for a transformer, or it may be some other type of opening, such as a cut-out opening, that also is present in the PWB 300 board's design.

Edge plate interconnect 310, contacts each of the first group 320 of conductive layers 320, but no others, while edge plate interconnect 316 interconnects both of the conductive layers of the second group 322. It should be understood, however, that edge plate interconnect 316, may be divided into two separate interconnects that separately connect the two conductive layers of group 322, and thereby, form two separate circuits. It should be noted that the conductive layers of the first group 320 may or may not be the same as the conductive layers of the second group 322 that contact the opening 327. This will vary with electrical design.

A third group 330 of conductive layers do not terminate sufficiently close enough to the external, continuous edge 325 to contact the edge plate interconnect 310. Typically, they will be offset from the edge by as much as 25 mils so that the plating material does not plate to the surface at that point and contact the offset conductive layers.

A fourth group 335 of conductive layers terminate at the opening 327 and contact edge plate interconnect 317, which interconnects the individual conductive layers of group 322. As seen from this illustration, the conductive layers of group 322 are interconnected by interconnect 316, while the conductive layers of group 335 are interconnected by the separate interconnect 317, yet using the same opening. Thus, even though the conductive layers of group 322 and group 335 terminate at the same opening, they can form separate electrical circuits because they are interconnected by separate edge plate interconnects 316 and 317, unlike a recessed or conventional via. In an alternative embodiment, however, edge plate interconnects 316 and 317 may be a single interconnect extending around the entire opening, or the interconnects 316 and 317 may not run the entire depth of the board as shown, with respect to interconnect 317. Instead they may be divided into two separate interconnects that extend over only a partial distance of the depth of the board, similar to the edge plate interconnects 310 and 316.

A fifth group 340 of conductive layers also terminate with the external, continuous edge 325. However, they are interconnected by edge plate interconnect 315, which does not contact edge plate interconnect 310, and thus, forms a separate interconnect, unlike a recessed or conventional via. Also, it should be noted that the edge plate interconnects 310 and 315 do not extend onto an upper or a lower surface of the PWB 300.

Figure 3B:
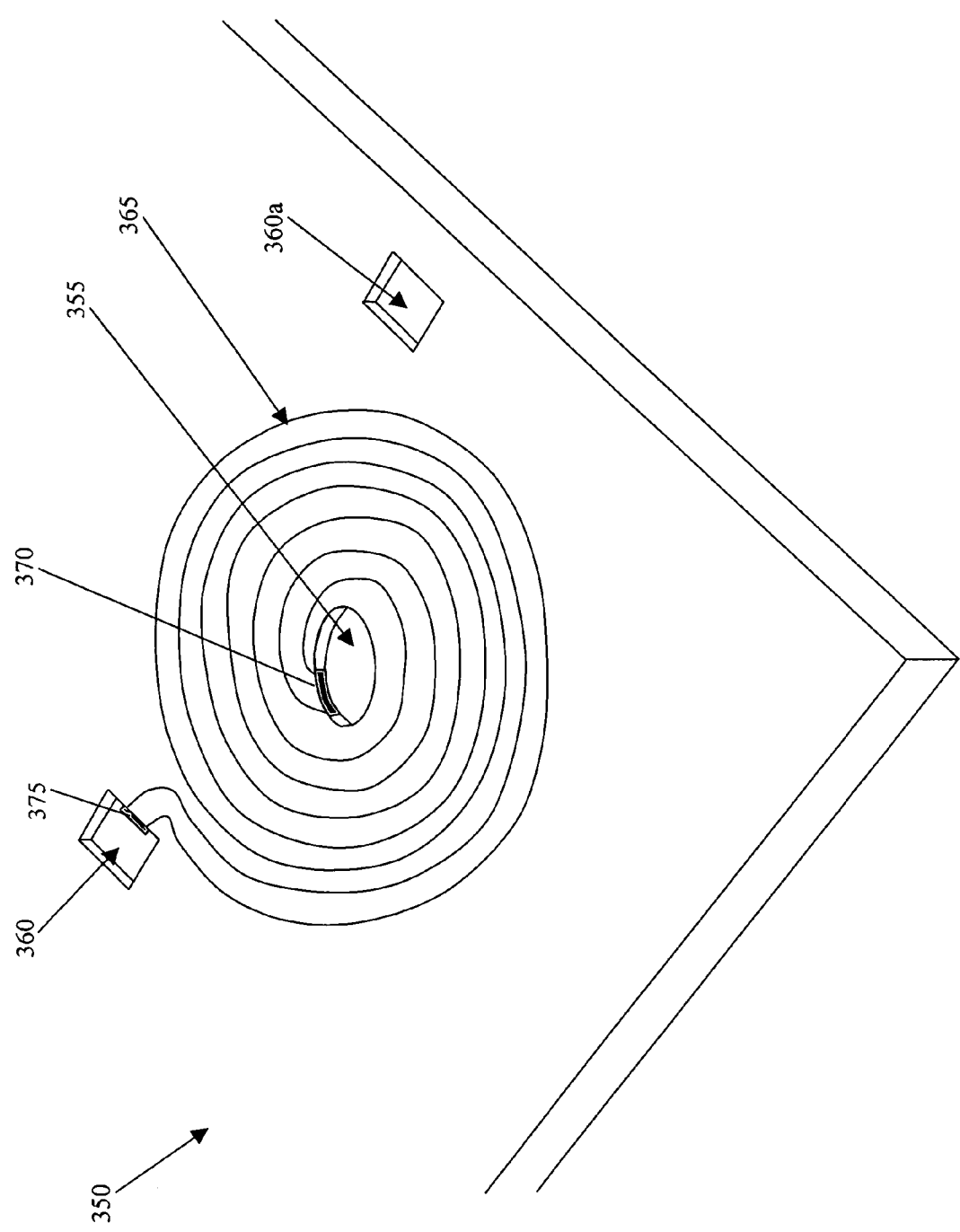
FIG. 3B illustrates a perspective view of one layer in a PWB showing how openings formed through the PWB can be used to connect a conductive layer to other conductive layers within the PWB.

Turning now to FIG. 3B, there is illustrated a perspective top view of a layer 350 of a PWB, illustrating how openings, such as a component opening 355 or other cut-out openings 360, 306a can be used with the edge plate technology, as provided by the present invention, to form interconnects for an electrical device and replace or supplement via structures. The illustrated embodiment provides a conductive trace 365 that extends from the component opening 355, such as a core-on-board opening, to the cut-out opening 360. Both of the opening 355 and 360 have edge plate interconnects 370, 375, respectively, such as those described herein, which utilizes existing openings in a PWB to eliminate conventional vias, and thereby, provide more component space on the board. The cut-out opening 360 allows interconnection to various layers throughout the PWB. These openings 355, 360 or 360a can be substituted for any conventional vias at any level in the board.

Figure 4:
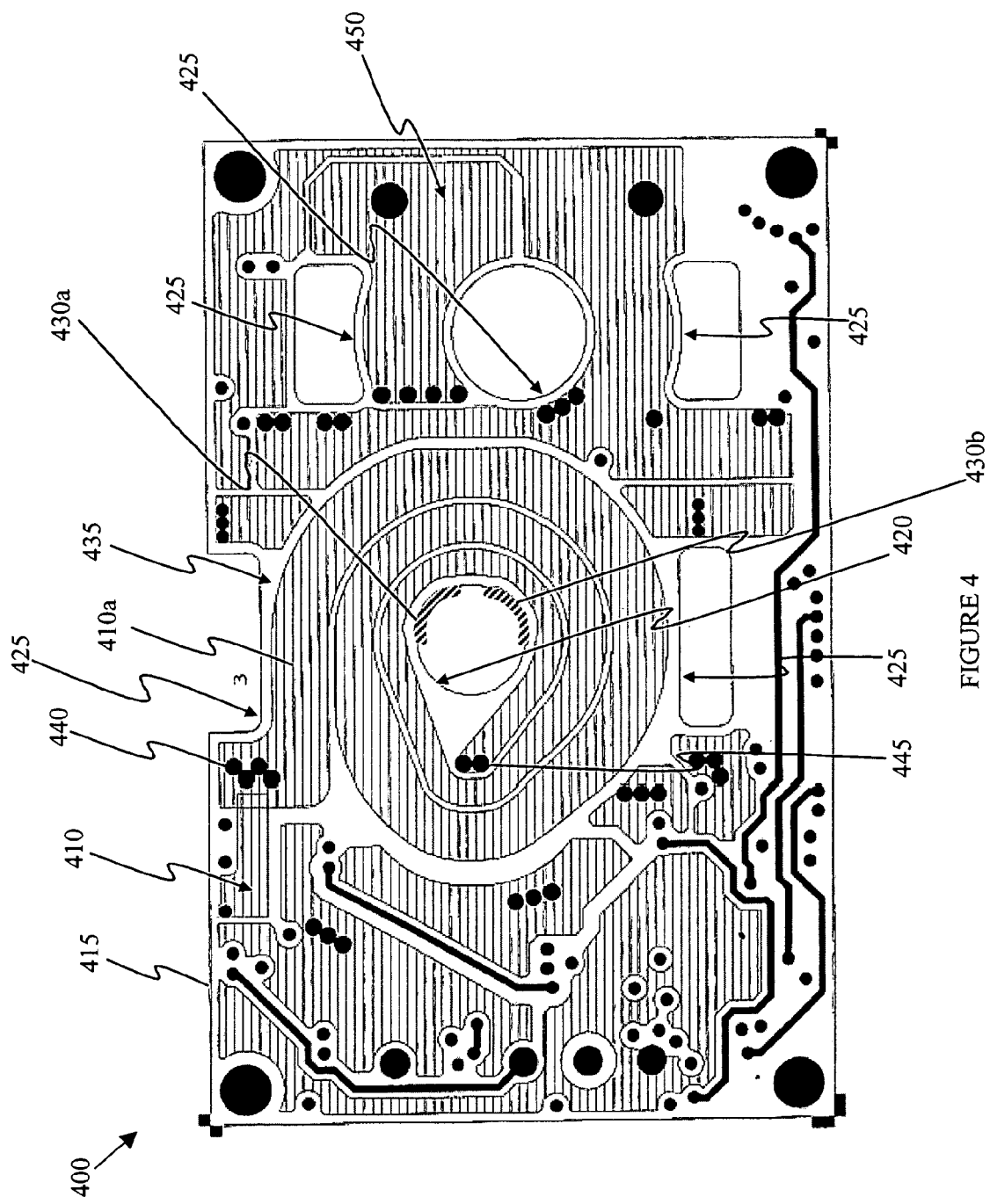
FIG. 4 illustrates an overhead view of another layer within the PWB of FIG. 2.

Referring now to FIG. 4, there is illustrated an overhead view of another insulating layer 400 of a stack of such insulating layers as previously discussed above. In this particular view, the insulating layer 400 has a conductive layer 410, such as a copper layer, conventionally patterned thereon. Again, the layout and overall configuration of the conductive layer 410 may vary, depending on design requirements. The insulating layer 400 has a continuous edge 415 at an outer perimeter of the insulating layer 400, which is not fully shown in this view. However, the insulating layer 400 further includes a continuous edge 420 and a continuous edge 425, which are cut-out edges, located within an interior portion of the insulating layer 400. In this view, the continuous edge 420 is an edge of an opening formed through the insulating layer 400 that is configured to receive the a magnetic core therethrough, to form a transformer, as discussed regarding FIGS. 1 and 2, and continuous 425 is an edge of an opening formed through the insulating layer 400 that is configured to either receive an another component therethrough or simply serve as an edge plate interconnect, as provided herein.

Located on edge 420 are a pair of electrically separate edge plate interconnects 430a and 430b, which are cross-hatched in the circular opening. However, unlike the previous level, the conductive layer 410 not does terminate or contact either edge plate interconnect 430a or 430b, since it is not desired for electrical connection to be made through the edge plate interconnects 430a or 430b. It does, however, wrap around the opening in a counter clockwise direction to form a winding 410a about a transformer region 435 and extends to vias 440 and 445 to interconnect the winding 410a to other layers. As with the previous level, the overall layout configuration, width, direction or number of turns of the winding 410a may vary depending on design requirements. In one particular embodiment, the winding 410a may form a primary winding about the transformer region 435 that is electrically connected to a primary circuit, not shown, by way of vias 440 and 445, but, in this particular embodiment, it does not form a portion of the winding around an inductor region 450. However, other embodiments may provide for such.

Figure 5:
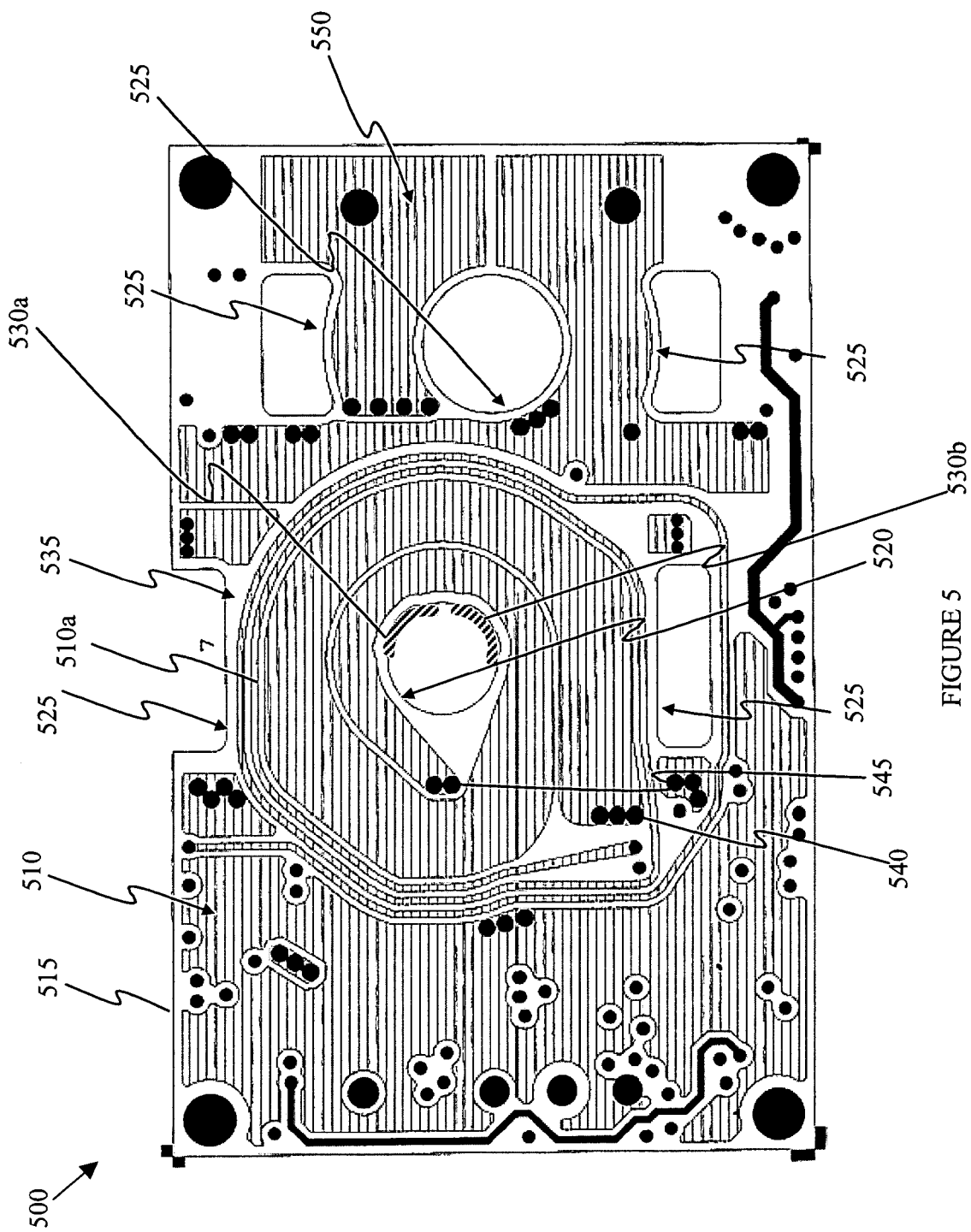
FIG. 5 illustrates an overhead view of another layer within the PWB of FIG. 2.

Referring now to FIG. 5, there is illustrated an overhead view of another insulating layer 500 of a stack of such insulating layers, as previously discussed above. In this particular view, the insulating layer 500 has a conductive layer 510, such as a copper layer, conventionally patterned thereon, whose overall configuration may vary, depending on design requirements. The insulating layer 500 has a continuous edge 515 at an outer perimeter of the insulating layer 500, which is not fully shown in this view. However, the insulating layer 500 further includes a continuous edge 520 and a continuous edge 525, which are cut-out edges, located within an interior portion of the insulating layer 500. Edges 520 and 525 are preferably aligned with edges 420 and 425 described in FIG. 4. In this view, the edge 520 is an edge of an opening formed through the insulating layer 500 that is configured to receive the a magnetic core therethrough, to form a transformer, as discussed regarding FIGS. 1, 2 and 4, and one of the edges 525 is an edge of an opening formed through the insulating layer 500 that is configured to receive a magnetic core therethrough to form an inductor, as also discussed regarding FIGS. 1, 2 and 4, or receive another portion of the transformer magnetic core therethrough. The continuous edge 525 as with the layer discussed above with respect to FIG. 4 may also be a cut-out opening that simply serves as an edge plate interconnect as provided herein.

Located on edge 520 are a pair of electrically separate edge plate interconnects 530a and 530b, which appear as bumps or irregularities in the otherwise circular opening. However, unlike the previous level discussed in FIG. 2, the conductive layer 510 is not co-terminus with nor does it contact either edge plate interconnect 530a or 530b, since it is not desired for electrical connection to be made through the edge plate interconnects 530a or 530b. It does, however, wrap around the opening in a clockwise direction to form a winding 510a about a transformer region 535 and extends to vias 540 and 545 to interconnect the winding 510a to other layers. As with previous levels, the overall layout configuration, width, direction and number of turns of the winding 510a may vary depending on design requirements. In one particular embodiment, the winding 510a may form a primary winding about the transformer region 535 that is electrically connected to a primary circuit, not shown, by way of vias 540 and 545, but it does not, however, form a portion of the winding around an inductor region 550, although other embodiments may provide for such.

Figure 6:
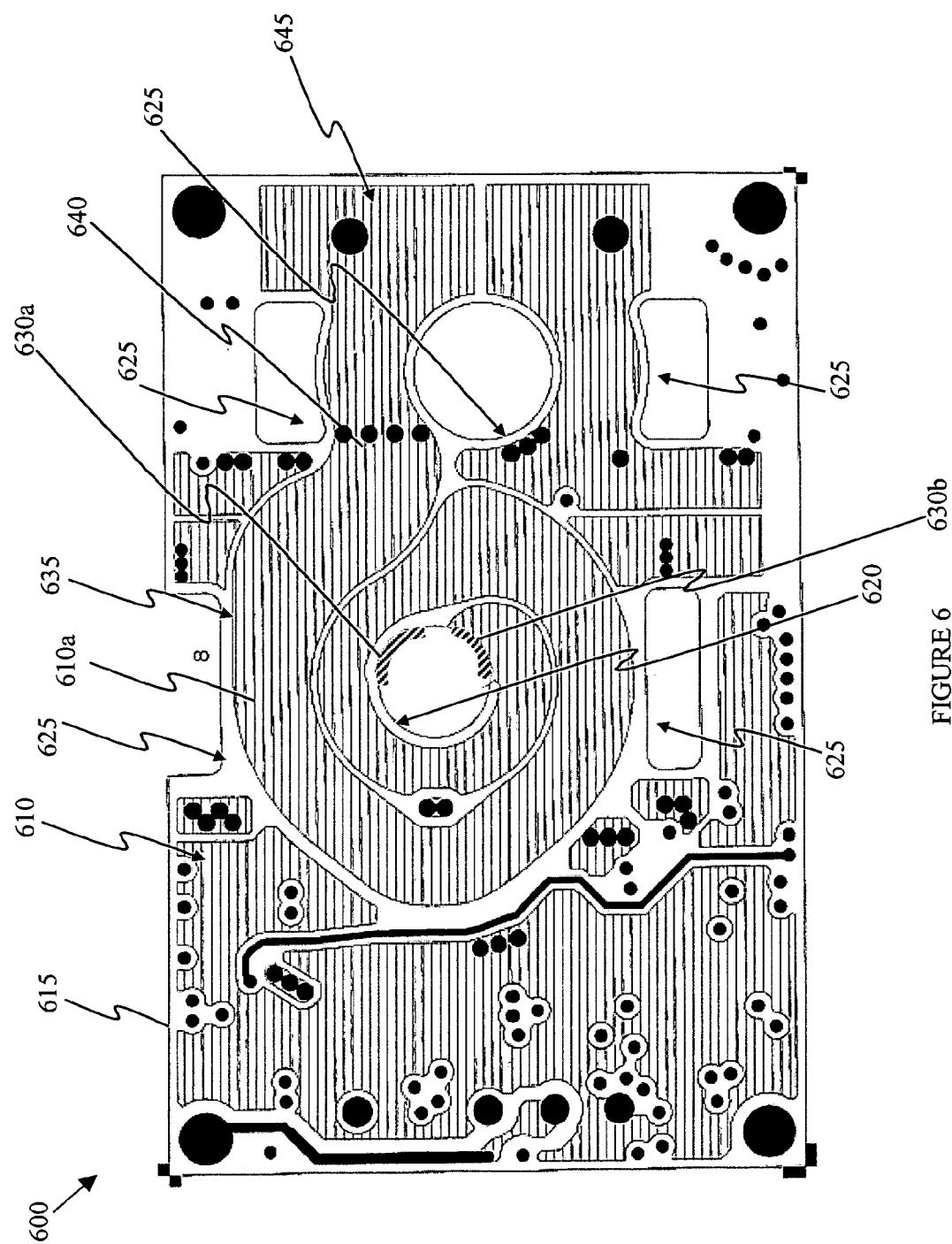
FIG. 6 illustrates an overhead view of yet another layer withing the PWB of FIG. 2.

Turning now to FIG. 6, there is illustrated an overhead view of one insulating layer 600 of a stack of such insulating layers as previously discussed above. In this particular view, the insulating layer 600 has a conductive layer 610, such as a copper layer, conventionally patterned thereon. The insulating layer 600 has an edge 615 at an outer perimeter of the insulating layer 600, which is not fully shown in this view. However, the insulating layer 600 further includes a continuous edge 620 and a continuous edge 625, which are cut-out edges, located within an interior portion of the insulating layer 600, and are preferably aligned with edges 420, 425 of FIG. 4 and edges 520, 525 of FIG. 5. As with the previous layers, edge 620 is an edge of an opening formed through the insulating layer 600 that is configured to receive a magnetic core therethrough, to form a transformer, as discussed regarding FIGS. 1, 2, 4 and 5, and edge 625 is an edge of an opening formed through the insulating layer 600 that is configured to receive a magnetic core therethrough to form an inductor or to receive another portion of the transformer magnetic core therethough, as also discussed regarding FIGS. 1, 2, 4 and 5 or simply serve as an edge plate interconnect.

Located on edge 620 are a pair of electrically separate edge plate interconnects 630a and 630b, which are cross hatched in the circular opening. While two edge plate interconnects 630a, 630b are shown, it should be understood that in some embodiments only one might be present or more than two might be present. A portion of the conductive layer 610 terminates at the edge 620, to an extent sufficient to form an electrical contact with the edge plate interconnect 630b and wraps around the opening in a clockwise direction to form a winding 610a about a transformer region 635 and extends to vias 640 that will interconnect the winding 610a to other layers. However, it should be noted that the winding 610a is also connected to other layers by the edge plate interconnect 630b. The overall layout configuration, width, direction and number of turns of the winding 610a may vary depending on design requirements. In one particular embodiment, the winding 610a may form a secondary winding about the transformer region 635 that is electrically connected to a secondary circuit, not shown, by way of the edge plate 630b and vias 640. As also shown, the winding 610a forms a portion of the winding around an inductor region 645. As with the previous layer discussed in FIG. 2, the edge plate interconnects 630a and 630b are located on a continuous edge of the PWB.

Figure 7:
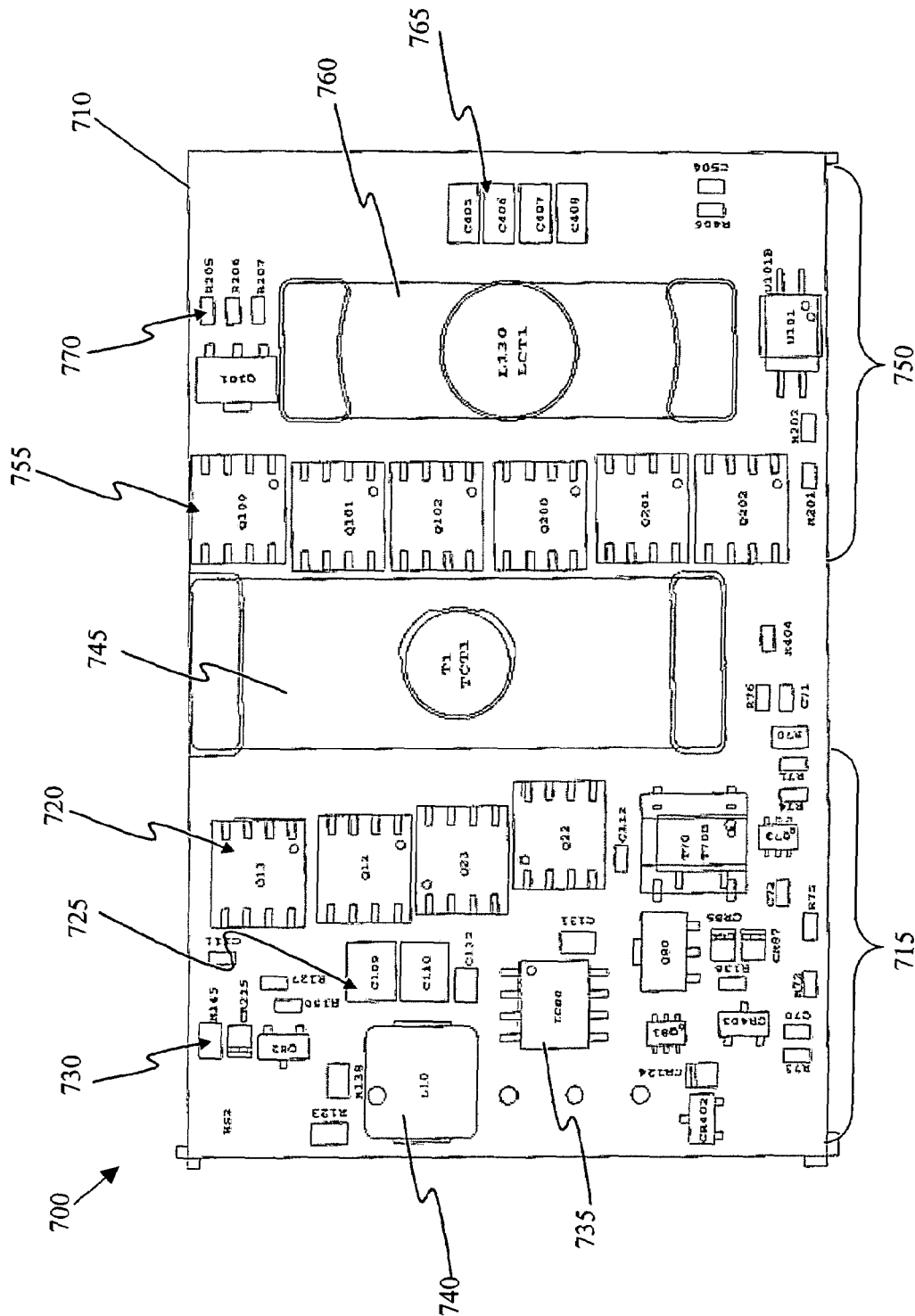
FIG. 7 illustrates an overhead view of a power converter implementing the edge plate interconnects provided by the present invention and as discussed herein with respect FIGS. 1 through 6.

Turning now to FIG. 7, there is illustrated an overhead view of a power converter 700 implementing the edge plate interconnects provided by the present invention and as discussed above with respect to other embodiments. In this embodiment, the power converter 700 includes a PWB 710 including the insulating layers and conductive layers, as discussed above. In one embodiment, the power converter 700 includes a primary circuit 715, including primary inverter switches 720, primary capacitors 725, primary resistors 730, a primary controller 735 and a primary inductor 740. In one embodiment, the primary circuit 715 is electrically connected to the primary winding of a transformer 745, as described above. The power converter 700 further includes a secondary circuit 750 that includes rectifier switches 755, an output inductor 760, output capacitors 765 and output resistors 770. The secondary circuit 750 is electrically connected to the secondary winding of the transformer 745, as also described above. As mentioned above, once in possession of the present invention, one who is skilled in the art would know how to construct the power convert 700.

Although the present invention has been described in detail, those skilled in the art should understand that they can make various changes, substitutions and alterations herein without departing from the spirit and scope of the invention in its broadest form.

What is claimed is:

1. A printed wiring board (PWB) for attaching electrical components thereto, comprising:
    a stack of insulating layers;
    conductive layers located between said insulating layers and wherein at least a portion of said conductive layers terminates at a continuous edge of a PWB; and
    an edge plate interconnect located on said continuous edge of said PWB that contacts at least a portion of said conductive layers at said continuous edge, wherein said continuous edge is an edge located on an edge of an opening formed within an interior of said PWB and said edge plate interconnect is a first edge plate interconnect that contacts a first conductive winding of said magnetic core within said PWB, and said PWB further includes a second edge plate interconnect located on said edge that contacts a second winding of said magnetic core within said PWB, said first and second edge plate interconnects forming separate interconnects for said first and second conductive windings, respectively and said opening is a core-on-board opening for a magnetic core having windings associated therewith.

2. The PWB as recited in claim 1 wherein said edge plate interconnect is a first edge plate interconnect that contacts a first set of said conductive layers at said continuous edge of said PWB, and said PWB further includes a second edge plate interconnect located on said edge that contacts a second set of said conductive layers at said continuous edge, said first and second edge plate interconnects forming separate interconnects.

3. The PWB as recited in claim 2 wherein said continuous edge is an external edge located at an outer perimeter of said PWB and said first and second edge plate interconnects form stacked interconnects.

* * * * *